United States Patent
Lynch et al.

(10) Patent No.: US 9,685,214 B2
(45) Date of Patent: Jun. 20, 2017

(54) DEVICES AND METHODS FOR CONTROLLING MAGNETIC ANISOTROPY WITH LOCALIZED BIAXIAL STRAIN IN A PIEZOELECTRIC SUBSTRATE

(71) Applicant: THE REGENTS OF THE UNIVERSITY OF CALIFORNIA, Oakland, CA (US)

(72) Inventors: Christopher S. Lynch, Sherman Oaks, CA (US); Jizhai Cui, Los Angeles, CA (US); Joshua Hockel, Los Angeles, CA (US); Gregory P. Carman, Los Angeles, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 14/740,147

(22) Filed: Jun. 15, 2015

(65) Prior Publication Data
US 2016/0005949 A1    Jan. 7, 2016

Related U.S. Application Data

(60) Provisional application No. 62/011,679, filed on Jun. 13, 2014.

(51) Int. Cl.
*G11C 11/22* (2006.01)
*G11C 11/16* (2006.01)
(Continued)

(52) U.S. Cl.
CPC .......... *G11C 11/1673* (2013.01); *G11C 11/14* (2013.01); *G11C 11/161* (2013.01);
(Continued)

(58) Field of Classification Search
CPC ....... G11C 11/15; G11C 11/14; G11C 11/161; G11C 11/1673; G11C 11/1675; G11C 11/22; G11C 11/2273; G11C 11/2275
See application file for complete search history.

(56) References Cited

U.S. PATENT DOCUMENTS 6,387,476 B1 * 5/2002 Iwasaki .................. G11B 5/00
                                                    428/212
7,304,880 B2 * 12/2007 Mizuuchi ............... G11C 11/22
                                                    257/E45.003
(Continued)

OTHER PUBLICATIONS

Lynch, Christopher S. et al., "Thin Film Ferroelectrics for Magnetic Coupling", PowerPoint presentation, NSF 11-537 IC4N Conference, Corfu, Greece, Jun. 17, 2013, pp. 1-28.

*Primary Examiner* — Andrew Q Tran
(74) *Attorney, Agent, or Firm* — O'Banion & Ritchey LLP; John P. O'Banion

(57) ABSTRACT

Devices and methods for controlling magnetic anisotropy and orientation of magnetic single domain structures between stable states are provided based on piezoelectric thin films and patterned electrodes. By using patterned electrodes, piezoelectric strain is manipulated to achieve a highly localized biaxial strain in a piezoelectric substrate and rotate the magnetic anisotropy of magnetic materials. Reorientation of a magnetic single domain between different stable states is accomplished by pulsing voltage across pairs of electrodes. Since only a small region surrounding the electrodes is strained, the methods can be applied to arrays of indexed magnetic elements and to piezoelectric thin films clamped to silicon base substrates.

12 Claims, 7 Drawing Sheets

(51) Int. Cl.
*G11C 11/14* (2006.01)
*H01L 41/047* (2006.01)
*H01L 41/09* (2006.01)
*G11C 13/00* (2006.01)

(52) U.S. Cl.
CPC ........ *G11C 11/1675* (2013.01); *H01L 41/047* (2013.01); *H01L 41/0926* (2013.01); *G11C 2013/0095* (2013.01)

(56) References Cited

U.S. PATENT DOCUMENTS

| | | | |
|---|---|---|---|
| 9,251,884 B2 * | 2/2016 | Elmegreen | G11C 11/22 |
| 2006/0239060 A1 * | 10/2006 | Shimada | G11C 11/22 365/145 |

* cited by examiner

DEVICES AND METHODS FOR CONTROLLING MAGNETIC ANISOTROPY WITH LOCALIZED BIAXIAL STRAIN IN A PIEZOELECTRIC SUBSTRATE

CROSS-REFERENCE TO RELATED APPLICATIONS

This application claims priority to, and the benefit of, U.S. provisional patent application Ser. No. 62/011,679 filed on Jun. 13, 2014, incorporated herein by reference in its entirety.

STATEMENT REGARDING FEDERALLY SPONSORED RESEARCH OR DEVELOPMENT

This invention was made with Government support under 1160504, awarded by the National Science Foundation. The Government has certain rights in the invention.

INCORPORATION-BY-REFERENCE OF COMPUTER PROGRAM APPENDIX

Not Applicable

BACKGROUND

1. Technical Field

The present technology pertains generally to magneto-electric heterostructures and more particularly to devices and methods that manipulate magnetic anisotropy of magnetic materials using highly localized biaxial strain in a piezoelectric substrate with patterned electrodes. Since only a small region surrounding the electrodes is strained, arrays of indexed magnetic elements can be created.

2. Background

The manipulation of magnetization at the micro- and nanoscale levels has been studied extensively for use in next generation computer memory, nanoscale sensors, and spintronic devices. Several approaches at controlling magnetization have been attempted including magnetic fields, spin-polarized current injection, exchange-bias, interface-charge-driven magnetoelectric (ME) effect, strain mediated ME effect, and ferroelectric/ferromagnetic coupling in single phase multiferroics, with limited success.

The use of a strain-mediated approach to control magnetization is attracting attention due to the promise of low energy consumption, large coupling coefficients, and the wide availability of piezoelectric-magnetoelastic materials.

For the past decade, researchers have focused on developing a magnetic memory element and other devices using a multiferroic material systems. One approach uses a strain-mediated composite consisting of layered piezoelectric plate with top and bottom electrodes and magnetoelastic materials strain coupled together at the interface. However, in this configuration the entire piezoelectric (or ferroelectric) plate is subjected to the same strain. The magnetism of individual magnetic structures cannot be independently controlled. Existing fabrication technology enables the development of layered structures in which a thin piezoelectric (or ferroelectric) layer can be deposited on a thicker substrate, e.g. PZT on Si. In this configuration with the top and bottom of the piezoelectric layer electrodes, the thicker substrate clamps the in-plane strain components.

Using the example of a multiferroic composite memory element, the multiferroic composite memory element is typically fabricated on a fairly thick substrate system, e.g., silicon. Substrate clamping is a significant issue. This thick substrate clamps the piezoelectric/magnetoelastic material, limiting the amount of strain that can be generated, posing a significant challenge for the implementation of controlling the magnetization of individual magnetic features such as a strain-mediated memory element. Bulk piezoelectric substrates require high voltage, are semiconductor incompatible, and are rate limited by elastic wave velocities through the thickness. Thin film piezoelectrics are also clamped by the thick substrate that prevents strain transfer limits in-plane strain.

Another consequence of the use of a monolithic piezoelectric substrate with the entire surface electrode is that all magnetic surface elements are subjected to the same strain field and would rotate or switch all of the elements simultaneously. The development of devices such as a strain-mediated multiferroic memory device requires the magnetization of each element to be individually controllable using a piezoelectric (or ferroelectric) thin film grown on a substrate such as a $Si/SiO_2$ wafer.

Achieving local control of individual magnetoelectric structures on a piezoelectric thin film is also a challenging problem. Piezoelectric thin films that are fully clamped in-plane by the substrate dramatically reduce the effective piezoelectric coefficient and restrict its capability of generating enough strain for controlling magnetization. Further, generating in-plane strain in a piezoelectric thin film on a length scale comparable to the substrate thickness typically requires bending of the entire substrate which is impractical.

Accordingly, a method is needed for controlling the magnetic behavior of individual magnetic islands features on the surface of a thin film piezoelectric using a strain mediated approach. The present technology satisfies this need and provides devices and methods for reorienting a single domain structure magnetization controlling magnetic behavior in a magnetoelastic surface feature deterministically using a strain-mediated approach by controlling strain in highly localized regions of a piezoelectric (or ferroelectric) layer that is fully clamped to a substrate.

BRIEF SUMMARY

The present technology exploits the edge effect that occurs at the edge of any surface electrode and dies off with distance from the electrode edge both toward and away from the electrode through the piezoelectric film. This is a highly in-plane strained region. Placing a magnetostrictive material on the surface of the film in this region results in the film strain modifying the magnetic properties of the material. This can lead to a number of devices and device configurations including square patterned electrodes separated by a distance on two or three thicknesses, the area under a square electrode with dimensions of the piezoelectric film thickness, the area along the edge of a line electrode, the area under a line electrode with width on the order of the piezoelectric film thickness, etc. Any magnetic feature can be placed in these in-plane strained regions to create a magnetoelectric effect.

Examples of devices include four and six patterned electrodes, memory devices, controlled permeability devices (switching from superparamagnetic to single domain ferromagnetic behavior), and any other device fabricated on thin film piezoelectric materials grown or deposited on a substrate wherein the electrode edge effects are taken advantage of to overcome the substrate clamping effect.

The technology is illustrated generally with an apparatus and method of using patterned electrodes on a piezoelectric substrate to generate local strain to control the magnetic properties of individual magnetic units. At least one dimension should be on the same length scale as the piezoelectric film thickness. This could be the gap between electrodes, the region within four thickness parameters of the electrode edge, the region on top of an electrode and within four thickness dimensions of the edge, or electrodes with all dimensions on the order of the film thickness and separated by similar dimensions. In one example configuration, the top surface electrodes are square with edge dimensions equal to the thickness of the piezoelectric material and with multiple surface electrodes separated by similar dimensions. The bottom surface is fully covered with an electrode layer. By application of an electric potential to one top surface electrode relative to the bottom electrode, the piezoelectric material can be made to expand out of plane and contract in-plane. The in-plane contraction will induce an in-plane extension in the material immediately surrounding the electrode that extends several critical dimensions away from the electrode. When two electrodes are similarly activated, the strain field that extends out from each will interact if they are in sufficiently close proximity. These localized strain effects are highly useful for the control of the magnetic behavior of local magnetic features. By operating electrode pairs on a piezoelectric substrate, a local bi-axial strain is generated between the electrodes. This can be used to rotate the magnetic anisotropy of a magnetic feature placed between the electrodes through the magnetoelastic effect.

The approach can also be scaled down to the micro- or nano-scale and used to achieve local in-plane strain on the surface of piezoelectric thin films that are subject to substrate clamping.

The devices and methods are illustrated with embodiment with four or six electrodes on a piezoelectric substrate operating in one of two modes that are distinguished by whether the electric field is applied through the thickness of the piezoelectric film or in the plane of the piezoelectric film.

In one preferred embodiment, the device is configured with top patterned electrodes and a bottom electrode. When an electric potential difference is applied to one pair of top electrodes relative to the bottom electrode, the direction of the electric field (E) along with the polarization direction (P) will be across the thickness of the plate. The piezoelectric material immediately under the electrodes will elongate out-of-plane (z-axis) and will contract in the x and y directions in-plane due to the $d_{31}$ effect. This induces a mechanical stretching of the material between the surface electrodes to accommodate the $d_{31}$ induced in-plane contraction under the electrodes. The magnetic element is elongated along the x direction ($\epsilon_{xx}>0$) and is contracted along the y direction ($\epsilon_{yy}<0$). This combined action of elongation and contraction represents a local bi-axial strain difference in the region between the electrode pair (i.e. $\epsilon_{xx}-\epsilon_{yy}>0$). Likewise, if the second electrode pair that is perpendicular to the first pair is activated, the magnetic element will experience elongation along the y direction ($\epsilon_{yy}>0$) and contraction along the x direction ($\epsilon_{xx}<0$). The result is that the strain field is rotated 90 degrees, (i.e. $\epsilon_{xx}-\epsilon_{yy}<0$). The net bi-axial strain, $\Delta\epsilon=\epsilon_{xx}-\epsilon_{yy}$, is the critical parameter for the creation of the in-plane magnetoelastic anisotropy for magnetism control schemes in strain coupled magnetoelectric heterostructures. The magnetization can be rotated by 90 degrees by switching the strain field from $\epsilon_{xx}-\epsilon_{yy}>0$ to $\epsilon_{xx}-\epsilon_{yy}<0$. The rotation of the biaxial strain field by patterned electrodes can be at angles other than 90 degrees. The strain field can be non-uniform with the average biaxial strain inducing the magnetic reorientation.

In another embodiment, the device is designed with only top patterned electrodes. A potential difference is applied to a pair of opposing top electrodes.

In a third embodiment, the patterned electrodes are disposed on both the top and the bottom surface of the piezoelectric substrate. The electric field will stay in-plane by applying both positive and negative voltages on paired electrodes. Here, the in-plane electric field (E) will induce an elongation of the material between electrodes due to the $d_{33}$ effect. In this configuration, the in-plane elongation of piezoelectric material will induce elongation ($\epsilon_{xx}>0$) and contraction ($\epsilon_{yy}<0$) on magnetic materials. Hence the net bi-axial strain $\Delta\epsilon=\epsilon_{xx}-\epsilon_{yy}$ is created on magnetic materials and the magnetization can be rotated by 90 degrees by operating effective paired electrodes (A-A or B-B).

According to one aspect of the technology, a piezoelectric device module is provided that with a bottom electrode; a plurality of top electrodes; and a piezoelectric substrate between the bottom electrode and the top electrodes, wherein the bottom electrode is a continuous planar electrode; wherein the top electrodes are separate patterned electrodes arranged around a magnetorestrictive area on the substrate; and wherein when a potential difference is applied between any pair of top electrodes and the bottom electrode positive voltage is applied across a pair of top electrodes, an electric field is created across the thickness of the substrate.

According to another aspect of the technology, a device is provided where the piezoelectric substrate material immediately under the electrodes will elongate out-of-plane and contract in-plane with the application of a voltage.

Another aspect of the technology is to provide a device where the material between the top electrodes mechanically stretches in response to in-plane contraction under the top electrodes.

A further aspect of the technology is to provide a device where the stretching and contraction can be controlled by applying a positive voltage potential difference between selected pairs of top electrodes and the bottom electrode.

Another aspect of the technology is to provide a structure with a wide variety of electrode patterns including two electrodes that look like parallel bars spaced apart on the order of the piezoelectric film thickness. The idea is to use the edge effect (a shear lag effect that affects the in-plane strain on the order of one or two dimensions of the film thickness extending into the electroded area and away from the electrode area).

Further objects and aspects of the technology will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWINGS

The technology described herein will be more fully understood by reference to the following drawing which is for illustrative purposes only.

DETAILED DESCRIPTION

Referring more specifically to the drawings, for illustrative purposes, embodiments of the apparatus and methods for controlling the magnetostrictive anisotropy of magnetic units with patterned electrodes creating localized biaxial strain in a piezoelectric substrate are generally shown. Several embodiments of the technology are described generally in FIG. 1 through FIG. 5E to illustrate the apparatus and methods. It will be appreciated that the methods may vary as to the specific steps and sequence and the apparatus may vary as to structural details without departing from the basic concepts as disclosed herein. The method steps are merely exemplary of the order that these steps may occur. The steps may occur in any order that is desired, such that it still performs the goals of the claimed technology.

The present technology uses local in-plane strain produced at the edges of an electrode that extends several thickness dimensions through the piezoelectric film beneath the electrode from the edges and away from the electrode. This localized in-plane strain can be used to control the magnetic behavior in magnetostrictive materials through the magnetoelastic effect, for example. The electrodes can be of any size or shape. The electrode pattern should not be limited to any particular number. For example, the device could use two electrodes that look like parallel bars spaced apart on the order of the piezoelectric film thickness.

The technology is also applicable to switching the magnetostrictive material from a superparamagnetic state to a single domain state using strain to produce large changes in magnetic permeability. The technology can be adapted to any setting where manipulations of mechanical or magnetic properties through the use of edge effects (a shear lag effect that affects the in-plane strain on the order of one or two plus dimensions of the film thickness) that can be exploited.

Figure 1A:
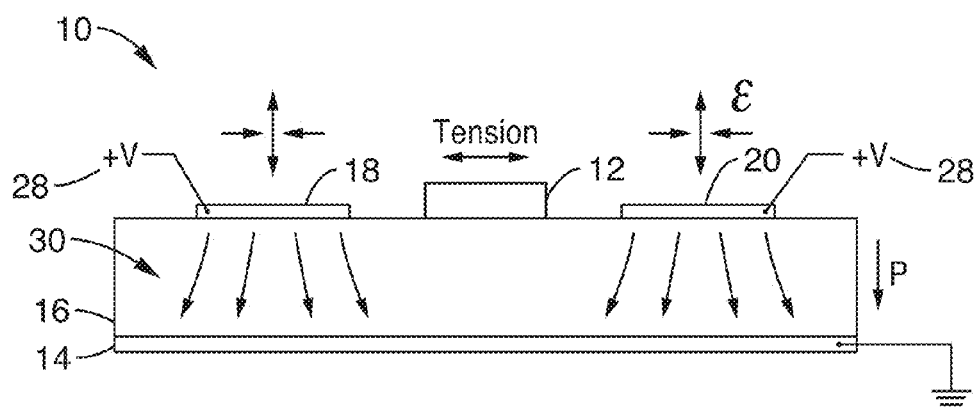
FIG. 1A is a schematic side view of one embodiment of a device with top patterned electrodes and full bottom electrodes.
Figure 1B:
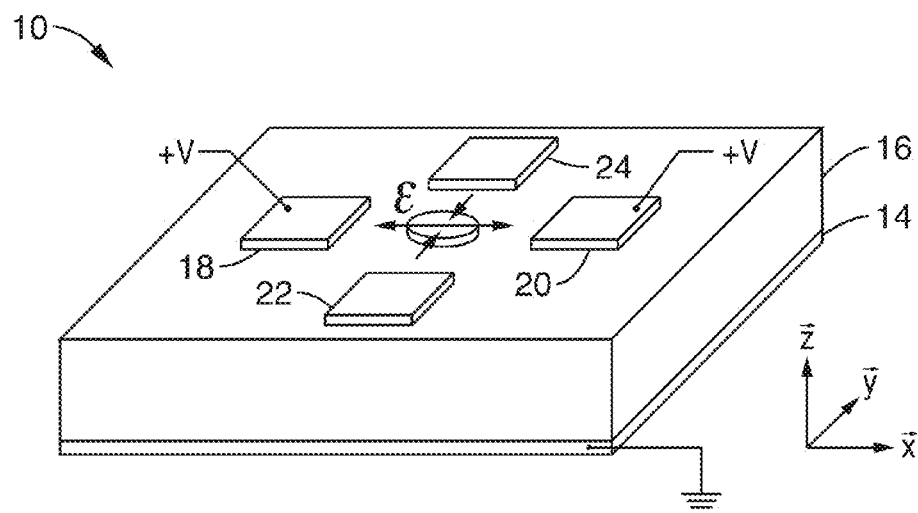
FIG. 1B is a schematic perspective view of the device of FIG. 1A with top patterned electrodes, magnetostrictive element and full bottom electrode.

Turning now to FIG. 1A and FIG. 1B, one apparatus 10 for manipulating magnetization and individual magnetostrictive units 12 or ferromagnetic islands is generally shown. The apparatus 10 has a bottom electrode 14 coupled to the bottom surface of a thin piezoelectric film substrate 16. Paired electrode 18 and electrode 20 (A-A) and electrode 22 and electrode 24 (B-B) are placed perpendicularly on the top surface of the piezoelectric substrate 16 and a voltage 28 is applied to produce an electric field 30 as shown in FIG. 1A and FIG. 1B. The plus and the ground symbols of the voltages 28 in the figures are arbitrary. The key is the electric field direction relative to the polarization direction. The patterned electrodes 18, 20 and electrodes 22, 24 induce localized strain in the piezoelectric substrate 16 to induce and reorient magnetic anisotropy in a magnetostrictive unit 12.

The embodiments shown in FIG. 1A through FIG. 3B have four orthogonal electrodes to illustrate the technology. However, other electrode patterns and structures can also be used. For example, the magnetic structures 12 can be placed on top of square electrodes to obtain bi-axial compressive strain, on top of line electrodes to obtain uniaxial compressive strain, between two square electrodes to obtain tensile strain toward the electrodes and orthogonal in-plane compressive strain, or between two line electrodes to obtain uniaxial tensile strain.

The electrodes are made of conventional conducting materials. However, the electrodes can also be made from conductive magnetic materials. This capability opens a new design space for nano-architectured magnetoelectric devices. The electrodes can also be formed with different shapes as long as the placement of the magnetostrictive material is within several film 16 thickness dimensions of an electrode edge, in one embodiment.

The piezoelectric material 16 underneath the electrodes 18, 20 elongates out-of-plane (z axis) due to the $d_{33}$ effect and contracts in-plane (x and y axis) due to the $d_{31}$ piezoelectric effect resulting in a mechanical stretching of the material between the surface electrodes to accommodate the piezoelectric in-plane contraction under the electrodes.

When a voltage 28 is applied to paired electrodes 18 and 20 as shown in FIG. 1B, the region between the electrodes containing the magnetostrictive element 12 is elongated along the x direction ($\epsilon_{xx}>0$) and contracted along the y direction ($\epsilon_{yy}<0$) creating a local bi-axial strain ($\epsilon_{xx}-\epsilon_{yy}>0$). Likewise, if electrodes 22 and 24 are activated with a voltage 28, the region containing the magnetostrictive element 12 will experience elongation along the y direction ($\epsilon_{yy}>0$) and contraction along x direction ($\epsilon_{xx}<0$). The result is that the bi-axial strain field is rotated by 90 degrees (i.e., $\epsilon_{xx}-\epsilon_{yy}<0$). The net bi-axial strain $\Delta\epsilon=\epsilon_{xx}-\epsilon_{yy}$ induces the in-plane magnetoelastic anisotropy necessary for control of individual magnetostrictive units 12 in strain-coupled magnetoelectric heterostructures. By operating effective electrode pairs, different local bi-axial strain fields can be generated to tune the magnetic properties of the magnetostrictive units 12. Since only a small region surrounding the electrodes is strained, the approach can be adapted to produce arrays of indexed magnetostrictive elements.

Figure 2A:
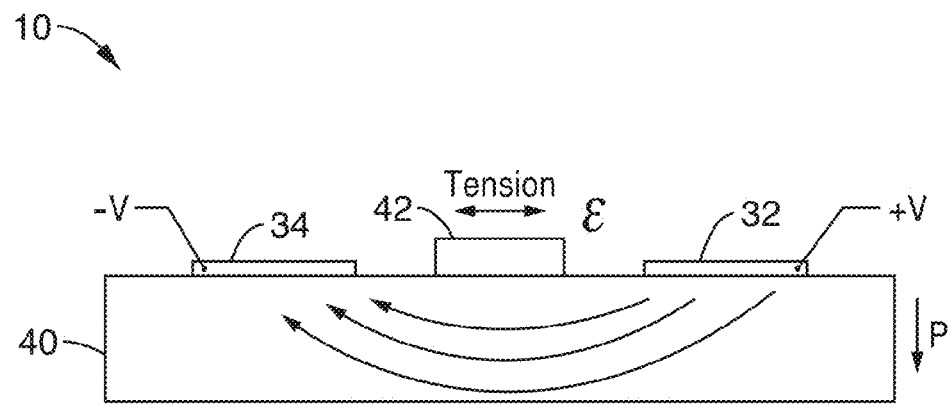
FIG. 2A is a schematic side view of an alternative embodiment of a device with top patterned electrodes alone.
Figure 2B:
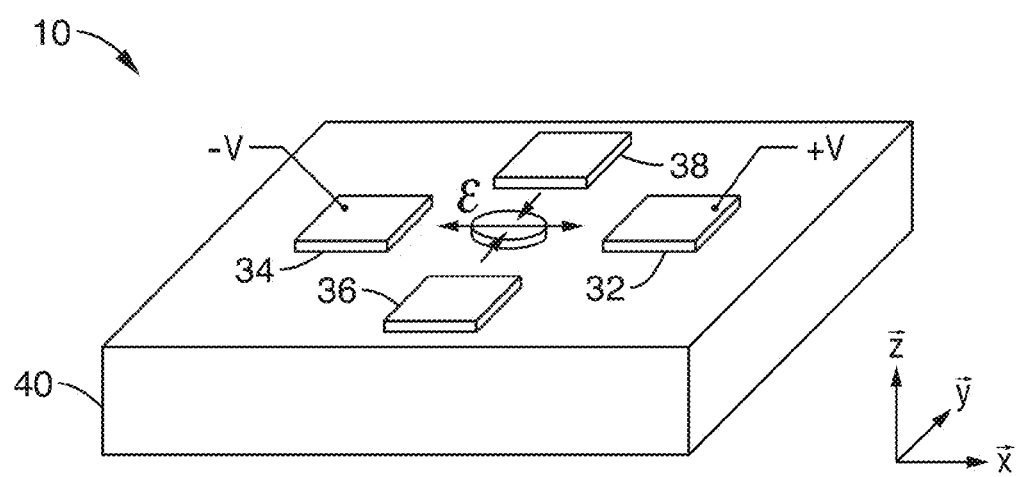
FIG. 2B is a schematic perspective view of the device of FIG. 2A with top patterned electrodes and central magnetostrictive element.

An alternative embodiment of the modular device 10 is shown in FIG. 2A and FIG. 2B. In this embodiment, the electrode pairs are positive electrode 32 and negative electrode 34 and positive electrode 36 and negative electrode 38 that are disposed on the top surface of the piezoelectric substrate 40. By applying both positive and negative voltages to the paired electrodes, the direction of the electric field (E) along with the polarization direction (P) will be in-plane as shown in FIG. 2A. The positive $\epsilon_{xx}$ and negative $\epsilon_{yy}$ strain fields are generated between electrodes, which generate magnetoelastic anisotropy on the magnetic element 42. The in-plane electric field (E) will induce an elongation of the material between electrodes due to the $d_{33}$ effect.

Figure 3A:
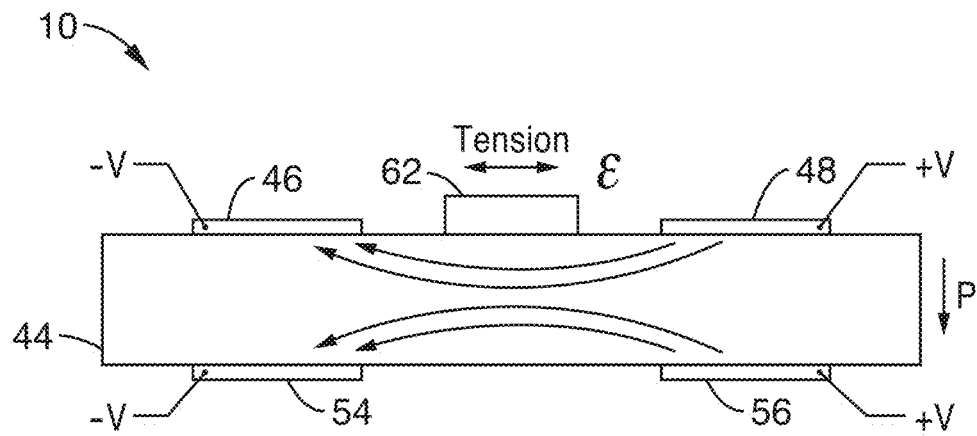
FIG. 3A is a schematic side view of a second alternative embodiment a device with a set of top patterned electrodes and a set of bottom patterned electrodes.
Figure 3B:
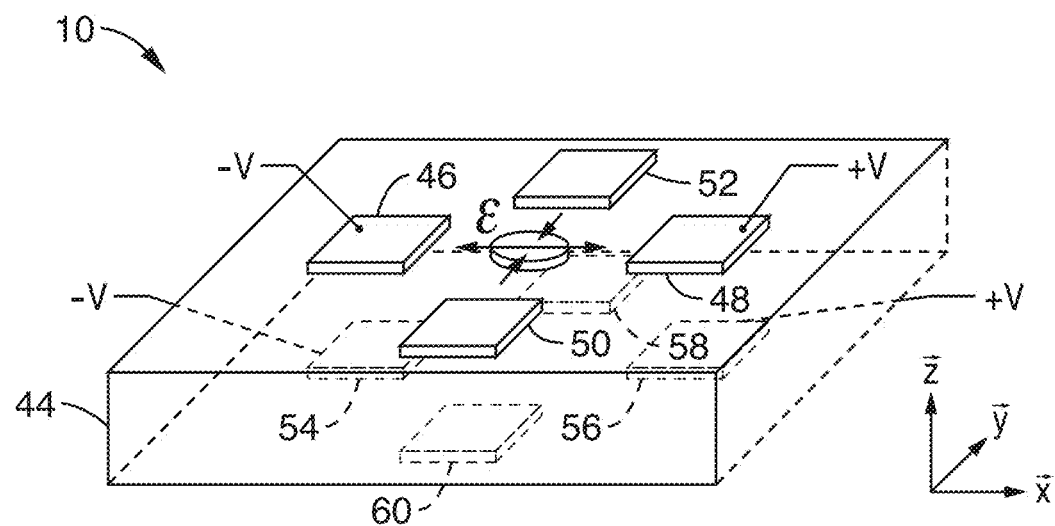
FIG. 3B is a schematic perspective view of the device of FIG. 3A with top patterned electrodes and central magnetostrictive element on the top surface of the piezoelectric thin film.

A symmetrical device structure with electrodes placed on the top and bottom surfaces of the piezoelectric substrate 44 is shown in a second alternative embodiment 10 in FIG. 3A and FIG. 3B. In this embodiment, the electrode pairs disposed on the top surface of the piezoelectric substrate 44 are positive electrode 48 and negative electrode 46 and positive electrode 50 and negative electrode 52. In the embodiment shown in FIG. 3A and FIG. 3B, an identical corresponding pattern of electrodes is formed on the bottom side of the thin piezoelectric substrate 44. The electrode pairs disposed on the bottom surface of the piezoelectric substrate 44 are positive electrode 56 and negative electrode 54 and positive electrode 60 and negative electrode 58 in this embodiment.

By applying both positive and negative voltages on the paired electrodes on the top and bottom surfaces of the substrate 44, parallel in-plane electric fields (E) will induce an elongation of the material between electrodes due to the $d_{33}$ effect. A net bi-axial strain $\Delta\epsilon=\epsilon_{xx}-\epsilon_{yy}$ is created on magnetic materials 62 and the magnetization can be rotated by 90 degrees by operating the paired top electrodes (46-48 or 50-52) and bottom electrodes (54-56 or 58-60) individually or simultaneously.

Accordingly, piezoelectric strain can be manipulated by using patterned electrodes to achieve a highly localized biaxial strain in a piezoelectric substrate and rotate the magnetic anisotropy of magnetic materials. This structure and process can be scaled down to micro or nano scales and used to form arrays of indexed magnetic elements.

The technology described herein may be better understood with reference to the accompanying examples, which are intended for purposes of illustration only and should not be construed as in any sense limiting the scope of the technology described herein as defined in the claims appended hereto.

Example 1

To further demonstrate the operational principles of the devices and methods, finite element simulations (FEA) were used to design nanoarchitectured devices that were fabricated and used to demonstrate highly localized voltage controlled manipulation of an engineered magnetic domain structure in a Ni ring. The layer thicknesses of the figures do not reflect scale. A schematic diagram of a device structure that can create magnetoelastic anisotropy on magnetic elements (a ring is shown as an example) in three directions by applying voltage on three pairs of electrodes is shown in FIG. 4A and sequential actuation of the paired electrodes is shown in FIG. 4B through FIG. 4D.

The structure consists of a Si wafer substrate 68, a bottom electrode 66, a PZT thin film 64, and, in this case, three pairs of electrodes surrounding a middle magnetic element. The electrode 70 is paired with electrode 72 and is designated (A-A). Electrode 74 is paired with electrode 76 (B-B) and electrode 78 is paired with electrode 80 (C-C) in FIG. 4B through FIG. 4D. Three different in-plane magnetoelastic anisotropy directions can be achieved by applying voltage to either of the three different pairs of electrodes (A-A, B-B or C-C) in this illustration. The three pairs of electrodes spaced 60° apart are sufficient to deterministically manipulate the magnetization of magnetic elements.

When voltage is applied to one pair of top electrodes (A-A, B-B or C-C) while the bottom electrode 66 is grounded, the piezoelectric material underneath the electrode pair expands out-of-plane ($d_{33}$ effect) and contracts in-plane ($d_{31}$ effect), creating highly localized strain fields under each electrode and in their immediate vicinity. This highly localized strain field is an edge effect that occurs at the edges of electrodes and drops off in lateral (in-plane) dimensions within one or two film thickness dimensions. When the electrode dimensions are comparable to the film thickness, these "edge effects" extend under the entire electrode enabling a significantly increased effective $d_{33}$ and $d_{31}$. When two such electrodes are in close proximity, the strain fields interact and an in-plane bi-axial strain field is induced between the electrodes (tensile along the axis connecting the electrodes and compressive in the orthogonal direction).

Figure 4A:
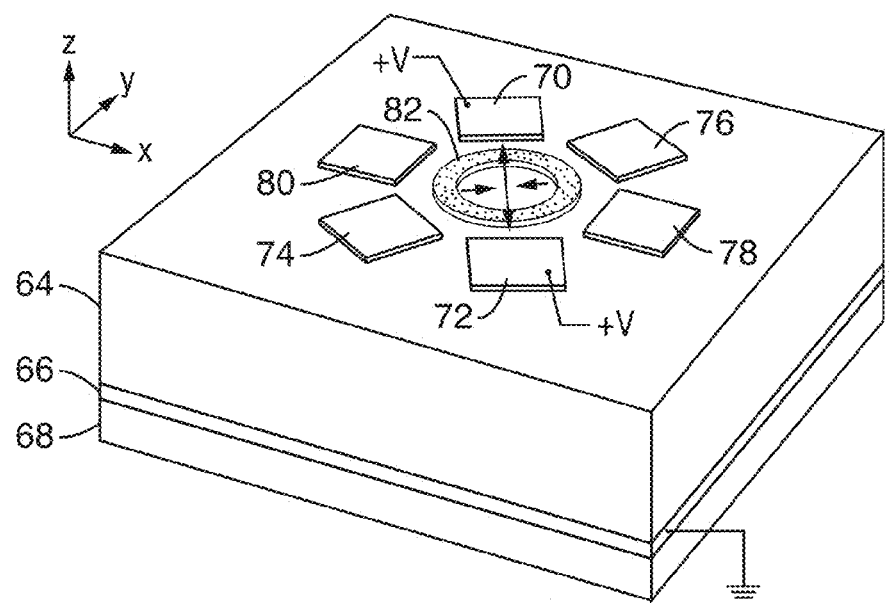
FIG. 4A is a schematic perspective view of a third alternative embodiment with six top patterned electrodes and a ring shaped central magnetostrictive element on the top surface of the piezoelectric thin film.
Figure 4B:
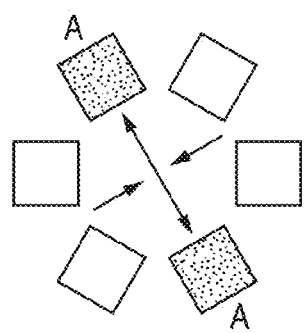
FIG. 4B through FIG. 4D depict the creation of magnetoelastic anisotropy on a ring shaped magnetic element in three directions by applying voltage on A-A, B-B or C-C electrodes respectively in another embodiment of the technology.
Figure 4C:
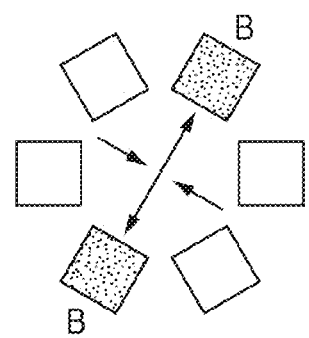
Figure 4D:
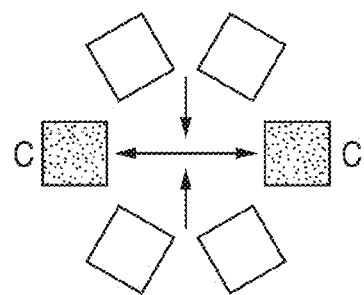

The design shown in FIG. 4A was fabricated on a chemical solution deposited 1 μm thick $PbZr_{0.52}Ti_{0.48}O_3$ thin film on a 0.5 mm thick Si wafer. Piezoelectric force microscopy (PFM) imaging demonstrated a clear piezoelectric response, highlighting out-of-plane polarization of the ferroelectric. The polarization versus electric field (P-E) hysteresis loop showed that the electrical coercivity is about 5 MV/m. The electric breakdown value of the film is about 70 MV/m.

The electrode patterns and magnetic Ni ring 82 structure on the thin film 64 were defined using a two-step e-beam lithography technique. Electrodes of 5 nm Ti and 100 nm Au were deposited by e-beam evaporation. By the same technique, 3 nm Ti and 15 nm Ni were deposited, followed by 2 nm Al as a capping layer protecting the Ni from oxidation. The size of the electrodes, electrode separation distance and Ni ring geometry were identical to the parameters used in the FEA simulation.

The experimental results mimicked the simulation results. The Ni ring 82 with 1000 nm outer diameter, 700 nm inner diameter and 15 nm thickness was marked with black and white regions or a notch to allow visualization of movement of the ring as seen in FIG. 4E and FIG. 4F.

Figure 4E:
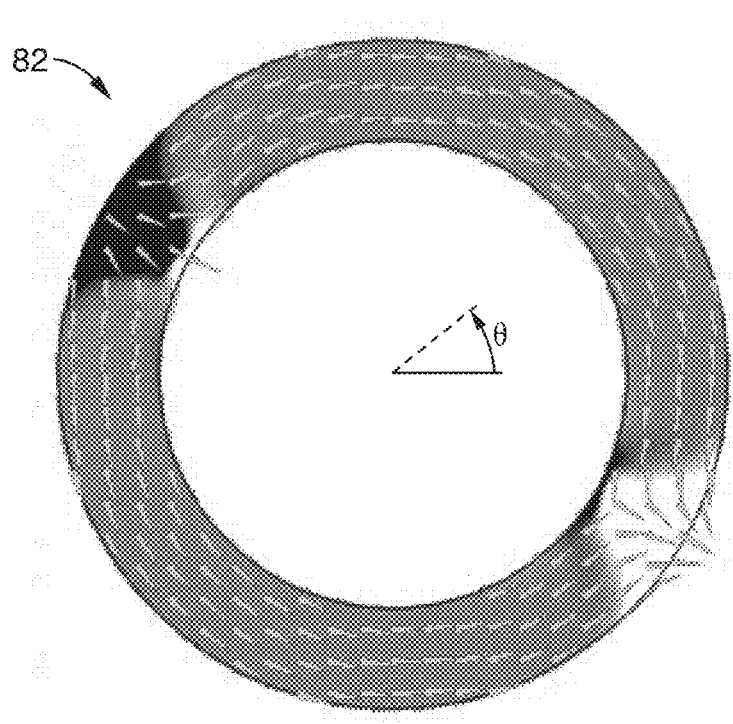
FIG. 4E and FIG. 4F depicts a micromagnetic simulation of a 1000 nm outer diameter, 700 nm inner diameter and 15 nm thick Ni ring initialized along θ=−30° direction.
Figure 4F:
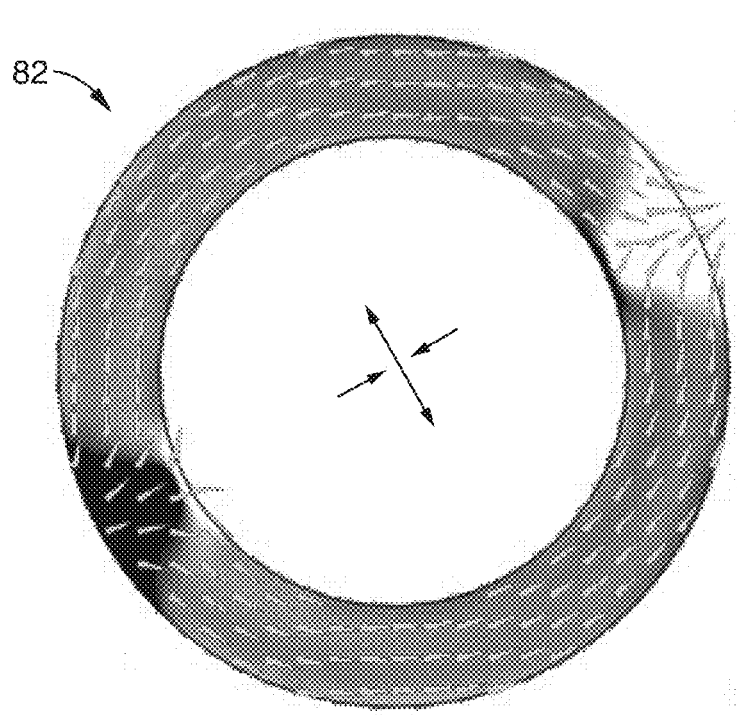

FIG. 4E shows the Ni ring initialized along δ=−30° direction. The arrows on the rings of FIG. 4E and FIG. 4F indicate the direction of the in-plane magnetization. The Ni ring subject to the 1200 ppm biaxial strain with direction shown in FIG. 4F as the centered arrows.

In the simulations, the Ni ring 82 of this geometry formed the "onion" state when magnetization was initialized at δ=−30° direction. The black and white regions on the ring are the position of two 180° head-to-head domain walls where there is out-of-plane magnetization component. When the 1200 ppm biaxial strain was applied to δ=30° direction (direction of biaxial strain is defined by the direction of the compressive strain), the ring magnetization rotated counter-clockwise by 60° and aligned with the compressive strain direction. When strain was unloaded, the magnetization stayed at the new position (δ=30°).

Accordingly, if the Ni ring 82 is initialized along δ=−30° direction, by applying voltage on A-A electrodes seen in FIG. 4B, then the generated strain rotated the magnetization from δ=−30° to δ=30°. Similarly, starting from the magnetization along δ=+30° and applying 25 V on C-C electrodes as shown in FIG. 4D, the magnetization continued to rotate to the δ=+90° direction (along the compressive strain). Starting the magnetization along δ=+30° and applying 25 V on B-B electrodes as shown in FIG. 4C, the results show the magnetization rotated back to δ=−30° direction aligned with the compressive strain direction. Therefore, the magnetization of a 1 um diameter Ni ring can be deterministically controlled by applying voltage on A-A, B-B or C-C electrodes.

The results demonstrate that magnetization control over the Ni ring structure is accomplished by creating highly localized strain with patterned electrodes, even though the PZT thin film is clamped by the underlying Si substrate. This method is directly applicable to a broad range of nanoscale strain-mediated multiferroic devices.

Example 2

In order to demonstrate the technology, an analytical model of a device with the structure shown in FIG. 1A and FIG. 1B was constructed to demonstrate the reorientation of the magnetization of a magnetostrictive ellipse, a configuration that could represent a memory bit or a component of a memory bit that could be part of an array of bits. The memory bit included an elliptical ferromagnetic element deposited on a ferroelectric layer with four patterned electrodes around the ferromagnetic element. All four boundaries of the PZT thin film were clamped by a Si substrate.

Specifically, the structure had a 500 nm piezoelectric transducer (PZT)-5H thin film with a Pt bottom ground electrode deposited onto a 0.5 mm thick Si substrate. A 150 nm×120 nm×10 nm Ni ellipse was surrounded by four 125 nm×125 nm×10 nm Au electrodes in this example. The two electrodes A-A were at a 45° angle, and the two electrodes B-B were at a 135° angle relative to the major axis of the ellipse (i.e., x-direction). The piezoelectric film was poled through the thickness in the z direction. The electric potential was applied to two top Au electrode sets (i.e., either A-A or B-B sets) with the bottom Pt Electrode being grounded so that the electric field is applied through the thickness of the film. By applying a voltage differential to the two electrode pairs, mechanical stretching was induced between the electrodes.

Figure 5A:
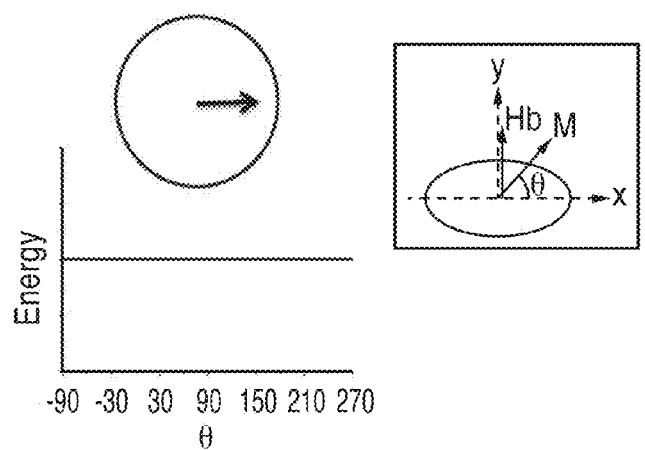
FIG. 5A is an energy diagram of a circular disk with an isotropic shape in-plane.
Figure 5B:
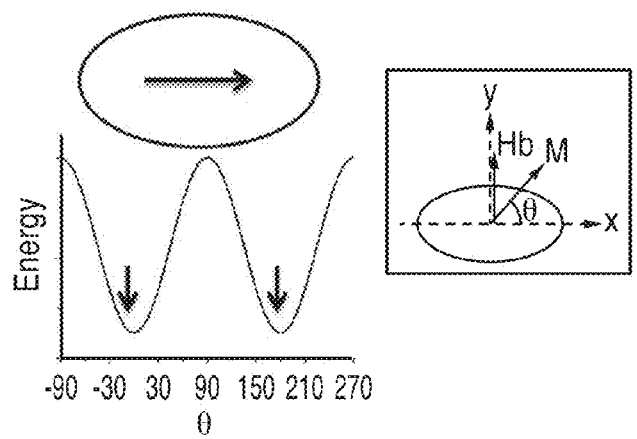
FIG. 5B is an energy diagram of an elliptical disk with an anisotropic shape induced easy direction along the major axis of the ellipse (0° or) 180°.

Magnetization energy profiles as a function of the magnetization angle were evaluated for a circular disk and an elliptical disk. For a circular disk, there were no preferential magnetic energy wells, thus the in-plane magnetization direction is independent of angle as seen in FIG. 5A. For an elliptical disk, however, there are two energy minima aligned along the major axis at 0° or 180° as illustrated in FIG. 5B.

Figure 5C:
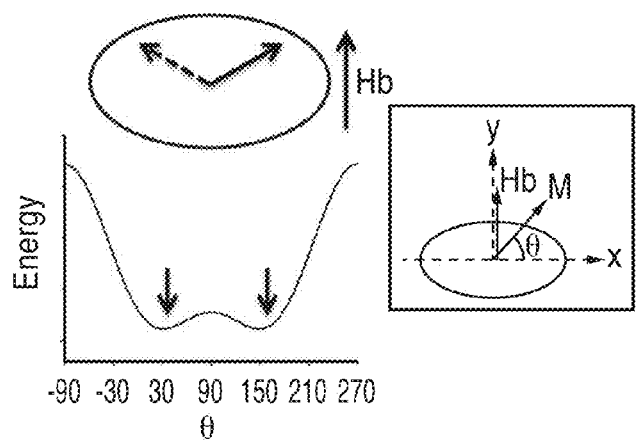
FIG. 5C is an energy diagram showing the bias field effect showing two stable states and the lowering of the energy barrier between the two states by the exposure to the bias field.

The energy diagram of FIG. 5C illustrates the bias field effect generating two stable states. The energy barrier between two states is also lowered by bias field $H_b$. By introducing a magnetic bias field ($H_b$) aligned along the ellipse's minor axis, two stable states are generated and the angle between the energy wells decreases, (i.e., from 0/180 to 45/135). The simultaneous application of a magnetic field and a mechanical strain to the magnetoelastic ellipse (e.g., negative magnetostriction) will modify the magnitude of the two energy wells relative to each other rather than substantially change the angle (i.e., 45/135). Therefore, the application of a constant magnetic bias field with the application and removal of a mechanical strain, allows deterministic strain-mediated switching between two stable states.

While not shown in FIG. 1A or FIG. 4A, an exchange layer could be used between the Pt and Ni structures for applying the bias field in-situ in one embodiment to allow the application of a magnetic bias field ($H_b$).

Figure 5D:
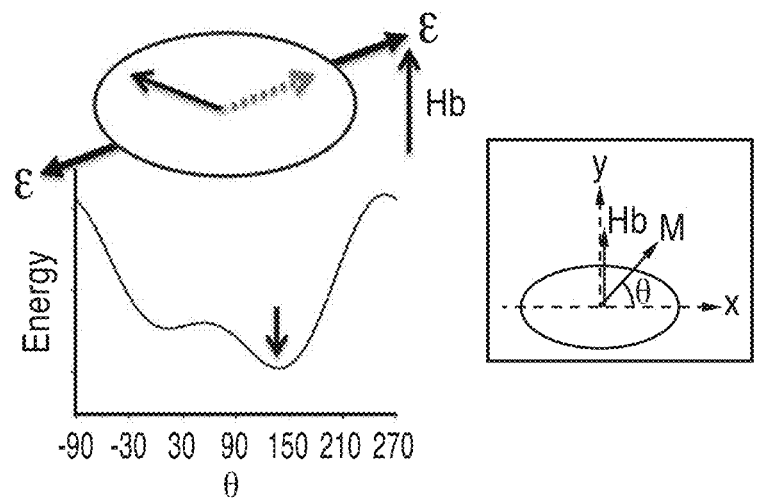
FIG. 5D and FIG. 5E are energy diagrams showing the interaction of shape anisotropy, bias field, and applied tensile strain, changing the energy profile (+θ or −θ).
Figure 5E:
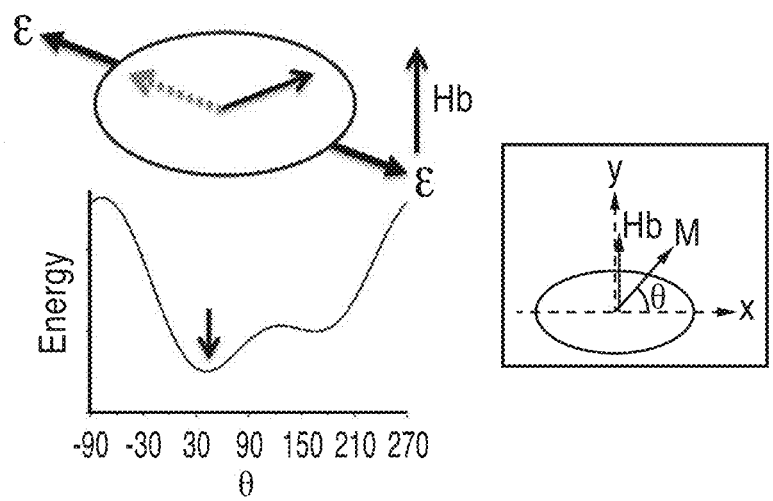

The energy diagrams of FIG. 5D and FIG. 5E illustrate the interaction of shape anisotropy, bias field, and applied tensile strain, changing the energy profile (+δ or −δ) respectively.

To test the devices, voltages were applied for a period of time sufficiently long to allow spin equilibrium to be obtained, and the voltage was then removed. All pretest simulations included a magnetic bias field applied along the minor axis of the nano-ellipse. Prior to application of the bias magnetic field or voltage, all magnetic spins were uniformly canted out of the x-y plane at 45° and allowed to precess toward an equilibrium state. Voltage applied on the A-A electrode pair caused the two electrodes to expand out-of-plane and tensile strain was induced in the middle region. Strain was also transferred to the nano-ellipse.

The influence of the bias field magnitude on the location of the magnetic energy wells and contour plots and strain distributions were also evaluated. Deformation plots illustrated the stretching of the ellipse along the A-A direction. This stretching causes the magnetic spins in a negative magnetic material like Ni to rotate toward the stable equilibrium position located at approximately 135°. The local anisotropic strain switches the magnetic spin state of the Ni ellipse (or energy wells) between the two stable energy wells, as shown in FIG. 5D and FIG. 5E.

When the voltage is removed, the magnetic spins are stable at ~135° and do not return to ~45°. Following this voltage loading sequence, electrodes B-B are energized and the displacement of the Ni nanoellipse is now along the B-B axis rather than along the A-A axis. Once the voltage is removed, the magnetic spins remain along the B-B axis since this is a stable equilibrium position.

In other words, when the voltage (A-A) is removed, the magnetization remains in this new state, since it represents a stable equilibrium well. When the second pair (B-B) is energized, the magnetization rotates back to ~45°, and remains there following removal of the voltage to B-B. The electrical energy required to "write" (switch) this magnetic single domain can be calculated from the surface charge on the electrodes and the applied voltage.

From the discussion above it will be appreciated that the technology described herein can be embodied in various ways, including the following:

1. A piezoelectric apparatus, comprising: (a) a thin piezoelectric substrate film; (b) a pattern of a plurality of paired electrodes on a surface of the piezoelectric substrate film, each electrode pair oriented linearly; and (c) one or more ferromagnetic islands on the piezoelectric substrate between the electrodes of at least one pair of electrodes; (d) wherein a bi-axial strain field is induced between pairs of electrodes upon application of a voltage across the electrodes; and (e) wherein magnetization of the ferromagnetic islands can be controlled by an applied voltage to the pairs of electrodes.

2. The device of any previous embodiment, further comprising: a silicon base mounted to the thin piezoelectric substrate film.

3. The device of any preceding embodiment, wherein each of the electrodes has at least one dimension that is approximately equal to a thickness of the thin piezoelectric substrate film.

4. The device of any preceding embodiment, wherein the ferromagnetic islands are planar with an elliptical shape.

5. The device of any preceding embodiment, wherein electrodes comprise two pairs of electrodes oriented orthogonally, the ferromagnetic island disposed between the pairs of electrodes.

6. The device of any preceding embodiment, wherein the electrodes comprise three pairs of electrodes in a circular orientation, the ferromagnetic island disposed between the pairs of electrodes.

7. The device of any preceding embodiment, further comprising: a second pattern of a plurality of paired electrodes oriented linearly on a surface of the piezoelectric substrate film opposite the first plurality of paired electrodes.

8. The device of any preceding embodiment, wherein the second pattern of paired electrodes is the same pattern as the first pattern of electrodes, wherein the electrodes are vertically oriented through the piezoelectric substrate film.

9. The device of any preceding embodiment, wherein one or more of the electrodes of the electrode pairs comprises a magnetic material.

10. A piezoelectric apparatus, comprising: (a) a thin piezoelectric substrate film; (b) a pattern of a plurality of paired electrodes on a top surface of the piezoelectric substrate film, each electrode pair oriented linearly; (c) a continuously planar bottom electrode mounted to the bottom of the piezoelectric substrate film; and (d) one or more magnetostrictive islands on the top surface of the piezoelectric substrate between the electrodes of at least one pair of electrodes; (e) wherein the piezoelectric substrate material immediately under the electrodes will elongate out-of-plane and contract in-plane when a voltage is applied; and (f) wherein magnetization of the magnetostrictive islands can be controlled by an applied voltage to the pairs of electrodes.

11. The device of any preceding embodiment, further comprising a silicon base coupled to the bottom electrode.

12. The device of any preceding embodiment, wherein each of the electrodes of the pattern of electrodes has at least one dimension that is approximately equal to a thickness of the thin piezoelectric substrate film.

13. The device of any preceding embodiment, wherein the electrodes comprise two pairs of electrodes oriented orthogonally, the magnetostrictive island disposed between the pairs of electrodes.

14. The device of any preceding embodiment, wherein the electrodes comprise three pairs of electrodes in a circular orientation, the magnetostrictive island disposed between the pairs of electrodes.

15. The device of any preceding embodiment, wherein the pattern of top electrodes comprises more than one circular cluster of paired electrodes, each cluster containing a magnetostrictive island.

16. The device of any preceding embodiment, wherein one or more of the electrodes of the electrode pairs comprises a magnetic material.

17. A method for magnetoelectric memory, the method comprising: (a) providing one or more magnetic memory elements of a piezoelectric thin film substrate with a pattern of top electrodes and at least one magnetic single domain structure on a top surface and a bottom electrode layer covering the bottom surface of the substrate; (b) reorienting the magnetic single domain between stable states by applying a voltage across pairs of top electrodes; and (c) reading the orientation of the single domain.

18. The method of any preceding embodiment, further comprising: providing a planar magnetic single domain structure in the shape of an ellipse with a major axis and a minor axis, the structure disposed between at least one pair of electrodes; applying a constant magnetic bias field aligned along the minor axis of the ellipse; and applying the voltage across the pair of top electrodes; wherein the ellipse is reoriented from a first stable state to a second stable state with the application of the voltage across the top electrodes.

19. The method of any preceding embodiment, further comprising: placing the magnetic single domain structure in a circle of top electrode pairs; and rotating the magnetic single domain structure by sequentially pulsing a voltage across each electrode pair.

20. The method of any preceding embodiment, wherein the magnetic memory element further comprises a base coupled to the bottom electrode layer.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

In the claims, reference to an element in the singular is not intended to mean "one and only one" unless explicitly so stated, but rather "one or more." All structural, chemical, and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. A piezoelectric device, comprising:
   (a) a thin piezoelectric substrate film;
   (b) a pattern of a plurality of paired top electrodes on a top surface of said piezoelectric substrate film, each top electrode pair oriented linearly;
   (c) a continuously planar bottom electrode mounted to the bottom of said piezoelectric substrate film; and
   (d) one or more magnetostrictive islands on said top surface of the piezoelectric substrate film located between the top electrodes of at least one pair of top electrodes;
   (e) wherein each of said top electrodes of the pattern of top electrodes has at least one dimension that is approximately equal to a thickness of said thin piezoelectric substrate film;
   (f) wherein the piezoelectric substrate film immediately under the top electrodes will elongate out-of-plane and contract in-plane when a potential is applied thereto; and
   (g) wherein magnetization of said magnetostrictive islands can be controlled by a voltage applied to said pairs of top electrodes.

2. The device as recited in claim 1, further comprising a silicon base coupled to said bottom electrode.

3. The device as recited in claim 1, wherein said top electrodes comprise two pairs of top electrodes oriented orthogonally, said magnetostrictive island located between said two pairs of top electrodes.

4. The device as recited in claim 1, wherein said top electrodes comprise three pairs of top electrodes in a circular orientation, said magnetostrictive island located between said three pairs of top electrodes.

5. The device as recited in claim 1, wherein said pattern of top electrodes comprises more than one circular cluster of paired top electrodes, each cluster containing a magnetostrictive island.

6. The device as recited in claim 1, wherein one or more of said top electrodes of said top electrode pairs comprises a magnetostrictive material.

7. A piezoelectric device, comprising:
   (a) a thin piezoelectric substrate film;
   (b) a pattern of a plurality of paired top electrodes on a top surface of the piezoelectric substrate film, each top electrode pair oriented linearly;
   (c) a continuously planar bottom electrode mounted to the bottom of the piezoelectric substrate film; and
   (d) one or more magnetostrictive islands on said top surface of the piezoelectric substrate film located between the top electrodes of at least one pair of top electrodes;
   (e) wherein the top electrodes comprise three pairs of top electrodes in a circular orientation, the magnetostrictive island located between the pairs of top electrodes;
   (f) wherein the piezoelectric substrate film immediately under the top electrodes will elongate out-of-plane and contract in-plane when a potential is applied thereto; and
   (g) wherein magnetization of the magnetostrictive islands can be controlled by a voltage applied to the pairs of top electrodes.

8. The device as recited in claim 7, further comprising a silicon base coupled to the bottom electrode.

9. The device as recited in claim 7, wherein one or more of the top electrodes of the top electrode pairs comprises a magnetostrictive material.

10. A piezoelectric device, comprising:
    (a) a thin piezoelectric substrate film;
    (b) a pattern of a plurality of paired top electrodes on a top surface of the piezoelectric substrate film, each top electrode pair oriented linearly;
    (c) a continuously planar bottom electrode mounted to the bottom of the piezoelectric substrate film; and
    (d) one or more magnetostrictive islands on the top surface of the piezoelectric substrate film located between the top electrodes of at least one pair of top electrodes;
    (e) wherein the pattern of top electrodes comprises more than one circular cluster of paired top electrodes, each cluster containing a magnetostrictive island;
    (f) wherein the piezoelectric substrate film immediately under the top electrodes will elongate out-of-plane and contract in-plane when a potential is applied thereto; and
    (g) wherein magnetization of said magnetostrictive islands can be controlled by a voltage applied to said pairs of top electrodes.

11. The device as recited in claim 10, further comprising a silicon base coupled to the bottom electrode.

12. The device as recited in claim 10, wherein one or more of the top electrodes of the top electrode pairs comprises a magnetostrictive material.

\* \* \* \* \*